United States Patent
Nishimura

(10) Patent No.: US 7,063,407 B2
(45) Date of Patent: Jun. 20, 2006

(54) PIEZOELECTRIC ACTUATOR, METHOD FOR MANUFACTURING THE SAME, INK JET HEAD, AND INK JET RECORDING APPARATUS

(75) Inventor: Kazuo Nishimura, Osaka (JP)

(73) Assignee: Matsushita Electric Industrial Co., ltd., Osaka (JP)

( * ) Notice: Subject to any disclaimer, the term of this patent is extended or adjusted under 35 U.S.C. 154(b) by 84 days.

(21) Appl. No.: 10/637,833

(22) Filed: Aug. 8, 2003

(65) Prior Publication Data

US 2004/0036745 A1    Feb. 26, 2004

(30) Foreign Application Priority Data

Aug. 21, 2002  (JP) ............... 2002-240545

(51) Int. Cl.
*B41J 2/045* (2006.01)
*H01L 41/04* (2006.01)

(52) U.S. Cl. ............... 347/71; 347/70; 310/324; 310/358

(58) Field of Classification Search ........... 347/68–72; 310/358, 359, 324, 330, 331; 252/520.21; 428/209
See application file for complete search history.

(56) References Cited

U.S. PATENT DOCUMENTS 5,754,205 A * 5/1998 Miyata et al. ............... 347/70
6,051,914 A * 4/2000 Nishiwaki .................. 310/358
6,639,340 B1 * 10/2003 Qiu et al. ................... 310/358

FOREIGN PATENT DOCUMENTS

JP    09156099 A    6/1997

* cited by examiner

*Primary Examiner*—Manish Shah
*Assistant Examiner*—Geoffrey S. Mruk
(74) *Attorney, Agent, or Firm*—Harness, Dickey & Pierce, P.L.C.

(57) ABSTRACT

A piezoelectric actuator includes a vibration plate 26, a common electrode 27 formed on the vibration plate 26, a piezoelectric element 29 formed on the common electrode 27, a crystal control layer 28 formed on the piezoelectric element 29, a separate electrode 33 formed on the crystal control layer 28, and an electrode line 34 formed on the piezoelectric element 29. The crystal control layer 28 is formed in the displacement region. The crystalline structure of a piezoelectric element 29a in the displacement region is a perovskite structure, and that of a piezoelectric element 29b in the wiring region is a pyrochlore structure.

10 Claims, 14 Drawing Sheets

PIEZOELECTRIC ACTUATOR, METHOD FOR MANUFACTURING THE SAME, INK JET HEAD, AND INK JET RECORDING APPARATUS

TECHNICAL FIELD

The present invention relates to a piezoelectric actuator, a method for manufacturing the same, an ink jet head, and an ink jet recording apparatus.

BACKGROUND ART

Ink jet heads that record information by using the piezoelectric effect of a piezoelectric element have been known in the art.

An ink jet head of this type includes piezoelectric actuators including a common electrode, piezoelectric elements and separate electrodes deposited in this order, and an ink channel substrate in which pressure chambers are formed. A vibration plate is provided on one side of the piezoelectric actuators. The vibration plate is bonded onto the ink channel substrate via an adhesive. When discharging ink, a voltage is applied between the common electrode and the separate electrode, thereby contracting/expanding the piezoelectric element. The contraction/expansion is restricted by the vibration plate, whereby the piezoelectric actuator undergoes flexural deformation in the thickness direction. The flexural deformation changes the volume of the pressure chamber, whereby ink is discharged out of the pressure chamber through a nozzle.

The piezoelectric actuator described above includes a displacement region and a wiring region. The displacement region is located corresponding to the pressure chamber. The wiring region is a region other than the displacement region and is a region where an electrode line is provided for connecting the separate electrode with a driving circuit for applying a voltage between the electrodes.

It is common for a piezoelectric actuator as described above that a single piece of piezoelectric element is deposited across the displacement region and the wiring region for reasons such as to simplify the manufacture of the ink jet head. Moreover, the dielectric constant tends to be high when one attempts to obtain a high piezoelectric characteristic, and the piezoelectric element in the displacement region is required to have a high piezoelectric characteristic in order to improve the ink discharging performance. Therefore, a piezoelectric element having a high dielectric constant is deposited across the displacement region and the wiring region. In such a case, however, the piezoelectric element has a high dielectric constant not only in the displacement region but also in the wiring region, where a high piezoelectric characteristic is not required. Then, the electrostatic capacity between the electrodes in the wiring region is high, whereby a high voltage needs to be applied between the electrodes for discharging ink. As a result, an excessive load is placed upon the driving circuit.

One possible way to solve this problem may be to deposit a piezoelectric element having a low dielectric constant across the displacement region and the wiring region. In such a case, however, the piezoelectric element has a low dielectric constant not only in the wiring region but also in the displacement region. Then, the piezoelectric characteristic of the piezoelectric element in the displacement region decreases, which is not preferred for improving the ink discharging performance.

In view of this, Japanese Laid-Open Patent Publication No. 9-156099 discloses an ink jet head including a piezoelectric film layer between a piezoelectric element in the wiring region and an upper electrode, the piezoelectric film having a lower dielectric constant than that of the piezoelectric element. In this way, it is possible to decrease the overall dielectric constant of the piezoelectric element while preventing a decrease in the piezoelectric characteristic of the piezoelectric element in the displacement region.

In this ink jet head, however, a step occurs between the upper electrode in the displacement region and the upper electrode in the wiring region, whereby the upper electrode is likely to break. Moreover, since the piezoelectric characteristic of the piezoelectric element in the wiring region is different from that of the piezoelectric film, the piezoelectric element and the film are likely to be peeled off from each other.

Thus, development of a new technique has been called for in the art that is free of such a problem as described above and yet allows for a decrease in the overall dielectric constant of the piezoelectric element while preventing a decrease in the piezoelectric characteristic of the piezoelectric element in the displacement region.

DISCLOSURE OF THE INVENTION

It is an object of the present invention to provide a piezoelectric actuator in which the overall dielectric constant of the piezoelectric layer is decreased without decreasing the piezoelectric characteristic of the piezoelectric layer in the displacement region.

According to a first aspect of the present invention, there is provided a piezoelectric actuator, including a lower electrode, a piezoelectric layer formed on the lower electrode, and an upper electrode formed on the piezoelectric layer for applying, together with the lower electrode, a voltage across the piezoelectric layer, wherein: the piezoelectric layer includes a piezoelectric layer in a displacement region and a piezoelectric layer in a wiring region that is a region other than the displacement region; and a dielectric constant of the piezoelectric layer in the wiring region is lower than that of the piezoelectric layer in the displacement region.

Thus, according to the first aspect of the present invention, it is possible to decrease the overall dielectric constant of the piezoelectric layer by decreasing only the dielectric constant in the wiring region without decreasing the piezoelectric characteristic of the piezoelectric layer in the displacement region.

According to a second aspect of the present invention, there is provided a piezoelectric actuator, including a lower electrode, a piezoelectric layer formed on the lower electrode, and an upper electrode formed on the piezoelectric layer for applying, together with the lower electrode, a voltage across the piezoelectric layer, wherein: the piezoelectric layer includes a piezoelectric layer in a displacement region and a piezoelectric layer in a wiring region that is a region other than the displacement region; and the piezoelectric layer in the displacement region has a perovskite structure while the piezoelectric layer in the wiring region has a pyrochlore structure.

Thus, the piezoelectric layer in the displacement region has a perovskite structure while the piezoelectric layer in the wiring region has a pyrochlore structure, whereby the piezoelectric layer in the displacement region is ferroelectric while the piezoelectric layer in the wiring region has a lower dielectric constant than that of the piezoelectric layer in the displacement region. Therefore, according to the second aspect of the present invention, it is possible to decrease the overall dielectric constant of the piezoelectric layer without decreasing the piezoelectric characteristic of the piezoelectric layer in the displacement region.

According to a third aspect of the present invention, there is provided a piezoelectric actuator according to the second aspect, wherein a crystal control layer made of lead lanthanum titanate is formed on a surface of the piezoelectric layer in the displacement region that is closer to the upper electrode or on a surface thereof that is closer to the lower electrode.

Thus, the crystal control layer is formed on a surface of the piezoelectric layer in the displacement region that is closer to the upper electrode or on a surface thereof that is closer to the lower electrode, whereby during the step of depositing the piezoelectric layer, the piezoelectric layer in the displacement region can be grown with a perovskite structure. Therefore, according to the third aspect of the present invention, the piezoelectric layer in the displacement region can be grown with a perovskite structure.

According to a fourth aspect of the present invention, there is provided a piezoelectric actuator according to the third aspect, wherein an active layer made of one of Pt, a Pt—Ti alloy and an Ir—Ti alloy is formed on a surface of the crystal control layer that is away from the piezoelectric layer.

Thus, the active layer that serves to make a lead lanthanum titanate layer function as a crystal control layer is formed on a surface of the crystal control layer that is away from the piezoelectric layer, whereby the lead lanthanum titanate layer functions more actively as the crystal control layer. Therefore, during the step of depositing the piezoelectric layer, the piezoelectric layer in the displacement region can reliably be grown with a perovskite structure. Thus, according to the fourth aspect of the present invention, the piezoelectric layer in the displacement region can reliably be grown with a perovskite structure.

According to a fifth aspect of the present invention, there is provided a piezoelectric actuator according to the first aspect, wherein the piezoelectric layer is made of a piezoelectric ceramic material including at least one of lead titanate, lead zirconate titanate, lead zirconate, lead lanthanum titanate, lead lanthanum zirconate titanate and lead magnesium niobate.

Thus, according to the fifth aspect of the present invention, the piezoelectric layer is made of a piezoelectric ceramic material as described above, which is ferroelectric, whereby it is possible to realize a high piezoelectric characteristic in the piezoelectric layer in the displacement region.

According to a sixth aspect of the present invention, there is provided a piezoelectric actuator according to the second aspect, wherein the piezoelectric layer is made of a piezoelectric ceramic material including at least one of lead titanate, lead zirconate titanate, lead zirconate, lead lanthanum titanate, lead lanthanum zirconate titanate and lead magnesium niobate.

Thus, functions and effects similar to those of the fifth aspect can be obtained.

According to a seventh aspect of the present invention, there is provided an ink jet head including a piezoelectric actuator according to the first aspect.

According to an eighth aspect of the present invention, there is provided an ink jet head including a piezoelectric actuator according to the second aspect.

According to a ninth aspect of the present invention, there is provided an ink jet recording apparatus including an ink jet head according to the seventh aspect.

According to a tenth aspect of the present invention, there is provided an ink jet recording apparatus including an ink jet head according to the eighth aspect.

According to an eleventh aspect of the present invention, there is provided a method for manufacturing a piezoelectric actuator, including the steps of: forming an upper electrode made of one of Pt, a Pt—Ti alloy and an Ir—Ti alloy on a substrate; forming a lead lanthanum titanate layer on the upper electrode; partially removing the lead lanthanum titanate layer so as to leave a portion thereof in a displacement region, thereby obtaining a separated lead lanthanum titanate layer; forming a piezoelectric layer on the upper electrode and the separated lead lanthanum titanate layer; and forming a lower electrode on the piezoelectric layer.

According to a twelfth aspect of the present invention, there is provided a method for manufacturing a piezoelectric actuator, including the steps of: forming an upper electrode made of one of Pt, a Pt—Ti alloy and an Ir—Ti alloy on a substrate; partially removing the upper electrode so as to leave a portion thereof in a displacement region, thereby obtaining a separated upper electrode; forming a lead lanthanum titanate layer on the substrate and the separated upper electrode; forming a piezoelectric layer on the lead lanthanum titanate layer; and forming a lower electrode on the piezoelectric layer.

According to a thirteenth aspect of the present invention, there is provided a method for manufacturing a piezoelectric actuator, including the steps of: forming a vibration plate on a substrate and forming a lower electrode on the vibration plate, or forming a lower electrode that functions also as a vibration plate on a substrate; forming an active layer made of one of Pt, a Pt—Ti alloy and an Ir—Ti alloy on the lower electrode; forming a lead lanthanum titanate layer on the active layer; partially removing the lead lanthanum titanate layer so as to leave a portion thereof in a displacement region, thereby obtaining a separated lead lanthanum titanate layer; forming a piezoelectric layer on the active layer and the separated lead lanthanum titanate layer; and forming an upper electrode on the piezoelectric layer.

According to a fourteenth aspect of the present invention, there is provided a method for manufacturing a piezoelectric actuator, including the steps of: forming a vibration plate on a substrate and forming a lower electrode on the vibration plate, or forming a lower electrode that functions also as a vibration plate on a substrate; forming an active layer made of one of Pt, a Pt—Ti alloy and an Ir—Ti alloy on the lower electrode; partially removing the active layer so as to leave a portion thereof in a displacement region, thereby obtaining a separated active layer; forming a lead lanthanum titanate layer on the lower electrode and the separated active layer; forming a piezoelectric layer on the lead lanthanum titanate layer; and forming an upper electrode on the piezoelectric layer.

With the piezoelectric actuator of the present invention, the dielectric constant of the piezoelectric layer is decreased in the wiring region, where a piezoelectric characteristic is not required, while maintaining a high dielectric constant for the piezoelectric layer in the displacement region so as to ensure a high piezoelectric characteristic therein, whereby it is possible to decrease the overall dielectric constant of the piezoelectric layer without decreasing the displacement characteristic of the actuator. Thus, it is possible both to decrease the load on the driving circuit and to improve the ink discharging performance.

BEST MODE FOR CARRYING OUT THE INVENTION

Embodiment 1

Figure 1:
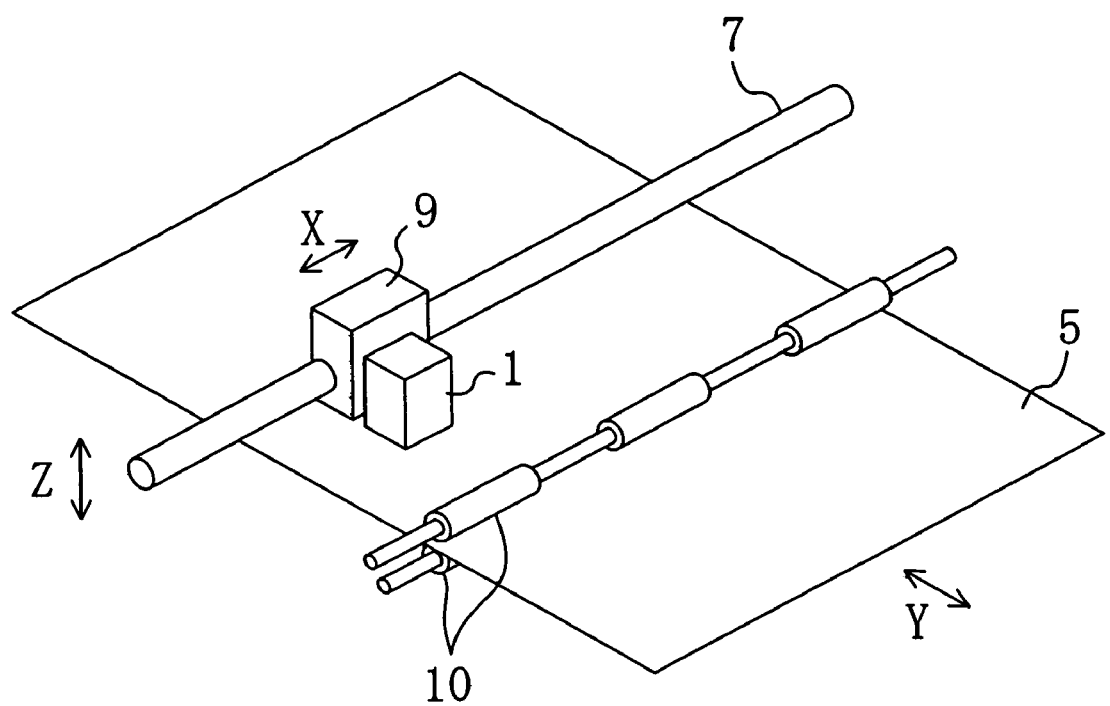
FIG. 1 is a schematic diagram illustrating an ink jet recording apparatus according to one embodiment of the present invention.

As illustrated in FIG. 1, an ink jet head 1 of the present embodiment is used in an ink jet printer 3, which is an ink jet recording apparatus. Ink droplets are discharged from the ink jet head 1 and land on a recording medium 5 such as paper, thereby recording information thereon.

The ink jet head 1 is mounted on a carriage 9 reciprocating along a carriage shaft 7 and is reciprocated in the primary scanning direction X along with the carriage 9. A pair of rollers 10 are provided for transferring the recording medium 5 in the secondary scanning direction Y by a predetermined amount after each iteration of the scanning movement of the carriage 9 in the primary scanning direction X.

Figure 2:
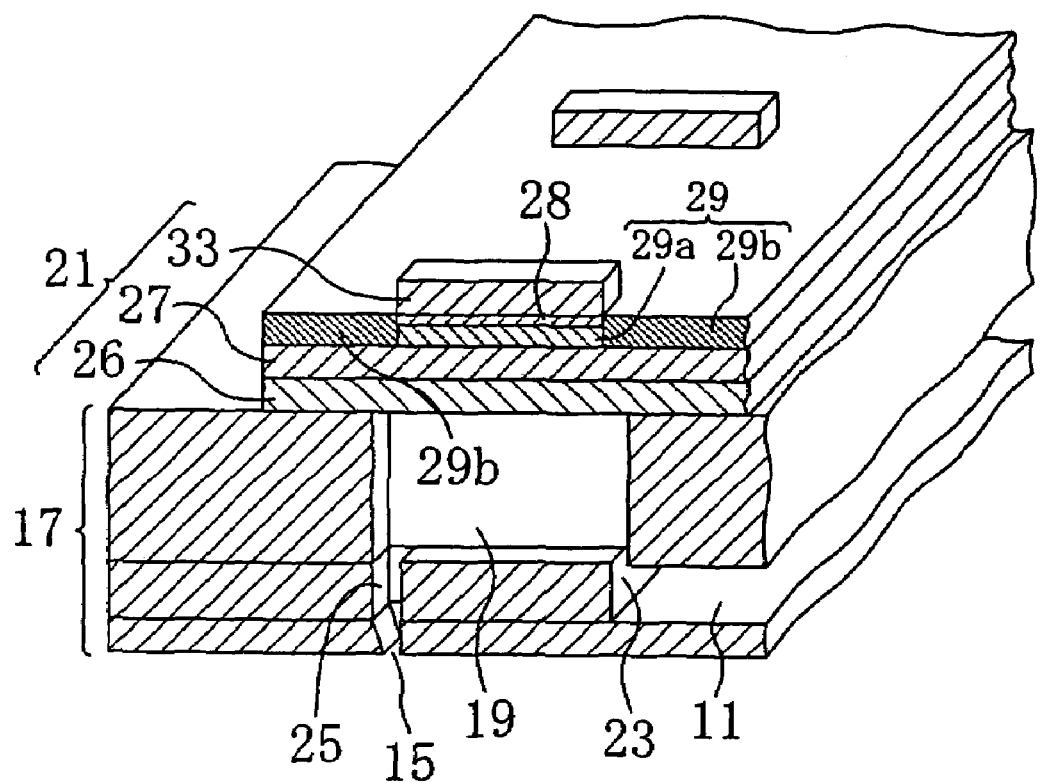
FIG. 2 is a partially-cutaway perspective view illustrating an ink jet head according to one embodiment of the present invention.
Figure 3:
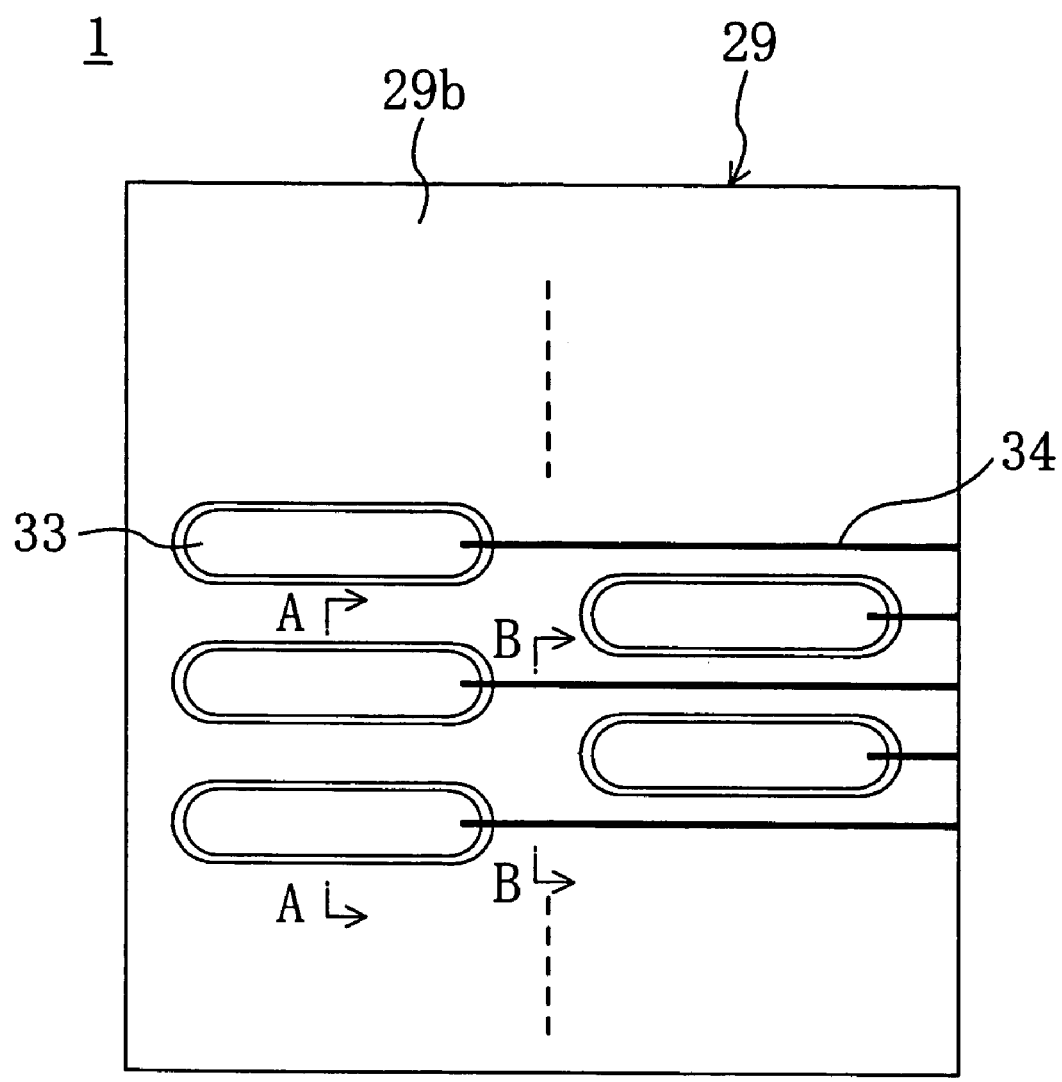
FIG. 3 is a plan view illustrating an ink jet head according to one embodiment of the present invention.
Figure 4:
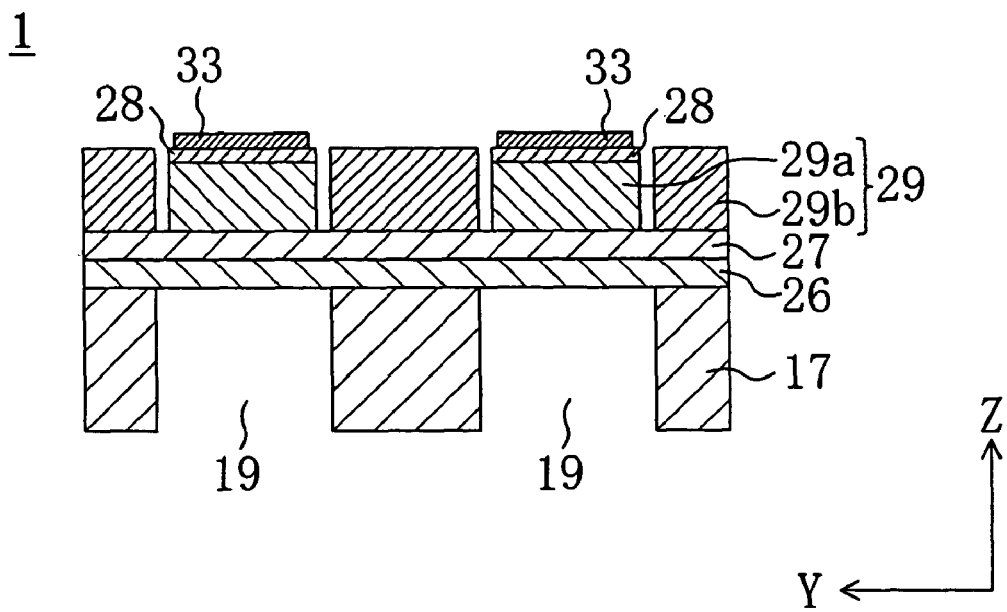
FIG. 4 is a cross-sectional view taken along line A—A of FIG. 3.
Figure 5:
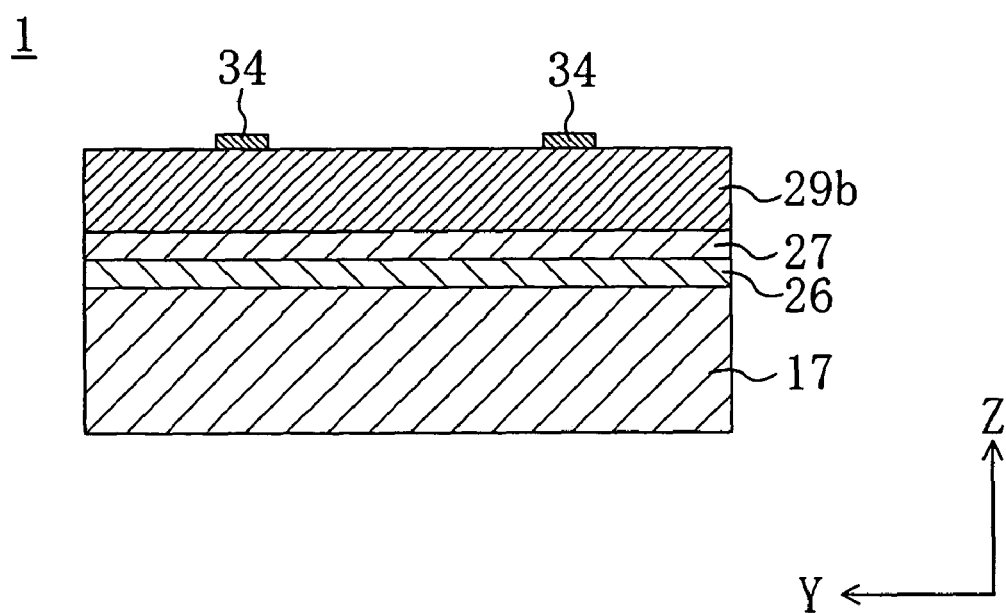
FIG. 5 is a cross-sectional view taken along line B—B of FIG. 3.

As illustrated in FIG. 2, the ink jet head 1 includes a head assembly 17 in which a common ink chamber 11, a plurality of pressure chambers 19 and a plurality of nozzles 15 are formed, and piezoelectric actuators 21 for applying a pressure on ink in the pressure chambers 19.

In the head assembly 17, the pressure chambers 19 are arranged at a predetermined interval in the secondary scanning direction Y. The cross section (the X-Y cross section) of the cavity of the pressure chamber 19 has a rectangular shape elongated in the primary scanning direction X. An ink supply port 23 connected to the common ink chamber 11 is formed at one end (the right-side end in FIG. 2) of the bottom of the pressure chamber 19 in the longitudinal direction, and an ink channel 25 connected to a nozzle 15 is formed at the other end (the left-side end in FIG. 2) thereof.

As illustrated in FIG. 2 to FIG. 5, the piezoelectric actuator 21 includes a vibration plate 26 made of Cr and having a thickness of 2 µm, a common electrode 27 made of Cu and having a thickness of 5.5 film, which is formed on the vibration plate 26, a piezoelectric element 29 made of $Pb(Zr,Ti)O_3$ (PZT) and having a thickness of 3 µm, which is formed on the common electrode 27, a crystal control layer 28 made of lead lanthanum titanate (PLT: $(Pb,La)TiO_3$) and having a thickness of 0.05 µm, which is formed on the piezoelectric element 29, a separate electrode 33 made of Pt and having a thickness of 0.2 µm, which is formed on the crystal control layer 28, and an electrode line 34 (not shown in FIG. 2) made of Pt and having a thickness of 0.2 µm, which is formed on the piezoelectric element 29 and is connected to the separate electrode 33. Note that the common electrode 27 corresponds to the "lower electrode" as used herein, the piezoelectric element 29 corresponds to the "piezoelectric layer", and the separate electrode 33 and the electrode line 34 correspond to the "upper electrode".

Herein, a portion of the piezoelectric actuator 21 corresponding to one pressure chamber 19 (a portion located directly above the pressure chamber 19) will be referred to as the "displacement region", and a portion of the piezoelectric actuator 21 other than the displacement region will be referred to as the "wiring region".

The crystal control layer 28 and the separate electrode 33 are formed in the displacement region. The crystal control layer 28 is provided so that during the step of depositing the piezoelectric element 29 to be described later, a portion of the piezoelectric element 29 that is formed on the crystal control layer 28 is grown with a perovskite structure.

A Pt layer acts upon a lead lanthanum titanate layer formed thereon so that the lead lanthanum titanate layer formed on the Pt layer can function as a crystal control layer. Therefore, the separate electrode 33, which is made of Pt, also serves to make the lead lanthanum titanate layer function as the crystal control layer 28. Note that the separate electrode 33 corresponds to the "active layer" as used herein.

The crystalline structure of a piezoelectric element 29a in the displacement region is a perovskite structure. A perovskite structure is a cubic crystalline structure that can be represented as $ABO_3$ (where A is Pb, and B includes Zr and Ti). The piezoelectric element 29a having a perovskite structure is ferroelectric. On the other hand, the crystalline structure of a piezoelectric element 29b in the wiring region is a pyrochlore structure. A pyrochlore structure is a crystalline structure that can be represented as $A_2B_2O_7$ (where A is Pb, and B includes Zr and Ti). As will be described below, the piezoelectric element 29b having a pyrochlore structure has a lower dielectric constant than that of the piezoelectric element 29a having a perovskite structure.

Figure 6:
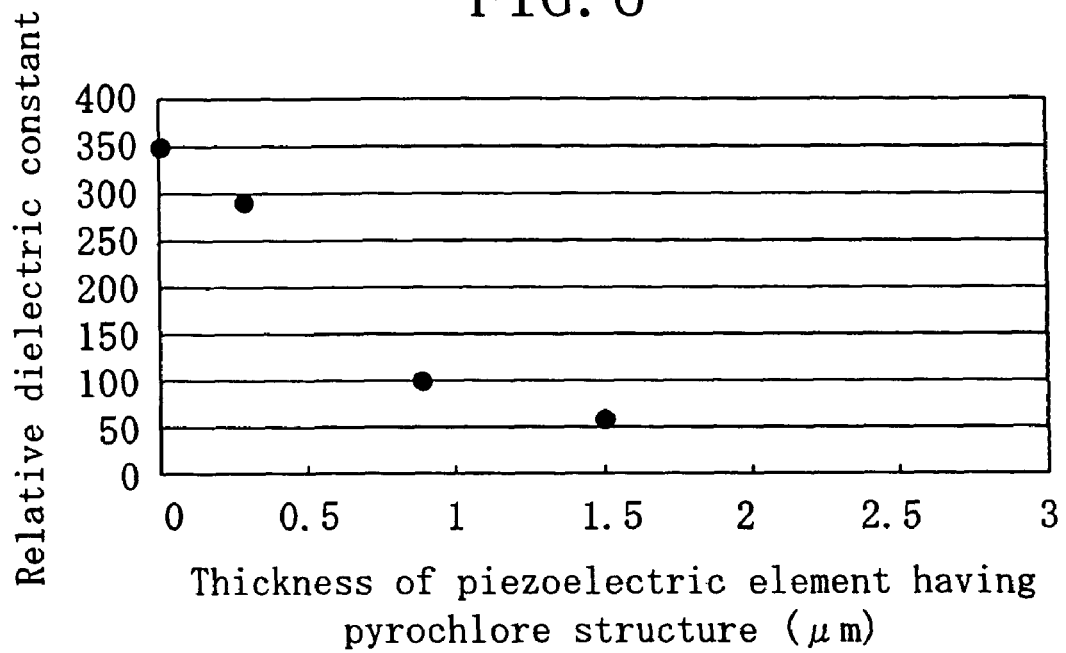
FIG. 6 is a graph illustrating the relationship between the thickness ratio and the relative dielectric constant of a two-layer film including a piezoelectric element having a perovskite structure and a piezoelectric element having a pyrochlore structure.

FIG. 6 illustrates the relationship between the thickness ratio and the relative dielectric constant of a two-layer film including a piezoelectric element having a perovskite structure (hereinafter referred to as a "perovskite layer") and a piezoelectric element having a pyrochlore structure (hereinafter referred to as a "pyrochlore layer"). The overall thickness of the two-layer film is 3.0 µm. For example, if the thickness of the perovskite layer is 2.1 µm, the thickness of the pyrochlore layer is 0.9 µm. As is apparent from FIG. 6, the relative dielectric constant increases as the thickness of the perovskite layer increases, whereas it decreases as the thickness of the pyrochlore layer increases.

It can be seen from FIG. 6 that the relative dielectric constant is 90 when the thickness of the perovskite layer is 2.1 µm and the thickness of the pyrochlore layer is 0.9 µm. Based on the value of the relative dielectric constant, the dielectric constant of a pyrochlore layer having a thickness of 3 µm is 32.9 (the relative dielectric constant is 60 when the perovskite layer and the pyrochlore layer are both 1.5 µm thick, and based on the value of the relative dielectric constant, the dielectric constant of a pyrochlore layer having a thickness of 3 µm is 32.8). It can also be seen from FIG. 6 that the dielectric constant of a perovskite layer having a thickness of 3 µm is 350 (300 to 450). Thus, when the piezoelectric element in the wiring region is a pyrochlore layer, the electrostatic capacity can be decreased 10-fold from that when it is a perovskite layer.

Consider a case where the electrostatic capacity is decreased 10-fold or so by depositing a PI (polyimide) film having a dielectric constant of 3.55 as a low dielectric constant film on a perovskite PZT film having a thickness of 3 µm as the piezoelectric element in the wiring region (see Japanese Laid-Open Patent Publication No. 9-156099, supra). Theoretically, the electrostatic capacity can be decreased 10-fold by providing a PI film having a thickness of 0.274 µm. However, it is very difficult to form a PI film having a thickness of 1 µm or less by an application process such as printing, and the performance, i.e., the insulation performance, of a PI film is not guaranteed when the thickness thereof is 1 µm or less. Therefore, in order to decrease the electrostatic capacity by forming a PI film, the thickness of the PI film is inevitably 1 µm or more, whereby a step occurs between the piezoelectric element in the wiring region and that in the displacement region, and thus decreasing the production yield.

Also in a case where an $SiO_2$ layer, a $TiO_2$ layer, or the like, is deposited as the low dielectric constant film by sputtering, CVD deposition, or the like, in order to decrease the electrostatic capacity 10-fold or so, a step occurs for a reason as described above, thereby decreasing the production yield. Moreover, this approach requires minute patterning and a vacuum process, thereby increasing the number of steps to be performed and thus the manufacturing cost.

In contrast, according to the present embodiment, the crystalline structure of the piezoelectric element 29a in the displacement region is a perovskite structure while that of the piezoelectric element 29b in the wiring region is a pyrochlore structure, whereby it is possible to prevent a decrease in the production yield by the breaking of a line due to the step, and it is possible to decrease the electrostatic capacity in the wiring region 10-fold at a low cost.

Each electrode line 34 is connected to an end of one separate electrode 33 and to a voltage input terminal section (not shown) for applying a voltage to the separate electrode 33.

Method for Manufacturing Ink Jet Head

Referring to FIG. 7A to FIG. 7D and FIG. 8A to FIG. 8D, a method for manufacturing the ink jet head 1 will now be described. The method for manufacturing the ink jet head 1 to be described below is a so-called "transfer process".

Figure 7A:
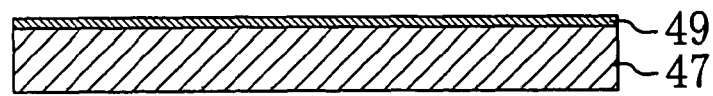
FIG. 7A to FIG. 7D illustrate a part of the manufacturing process of the ink jet head according to Embodiment 1 of the present invention.

First, as illustrated in FIG. 7A, an upper electrode 49 made of Pt is formed on an MgO substrate 47 by sputtering, vapor deposition, or the like.

Figure 7B:
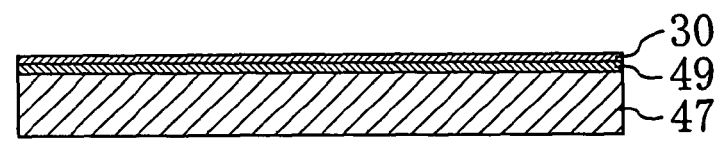

Then, as illustrated in FIG. 7B, a lead lanthanum titanate layer 30 is formed on the upper electrode 49 by sputtering, vapor deposition, or the like.

Figure 7C:
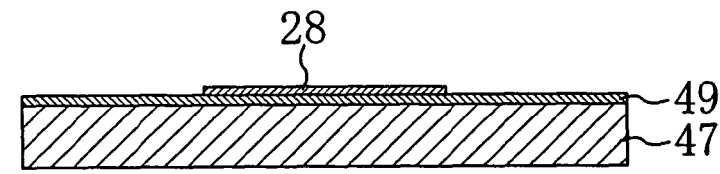

Then, as illustrated in FIG. 7C, the lead lanthanum titanate layer 30 is partially removed by etching, or the like, so as to leave a portion thereof in the displacement region, thereby forming the crystal control layer 28.

Figure 7D:
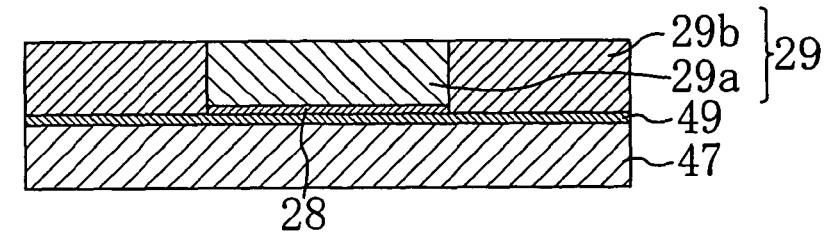

Then, as illustrated in FIG. 7D, the piezoelectric element 29 made of $Pb(Zr,Ti)O_3$ is formed on the crystal control layer 28 and the upper electrode 49 by sputtering, vapor deposition, or the like. Thus, the piezoelectric element 29a formed on the crystal control layer 28, i.e., in the displacement region, is grown with a perovskite structure. On the other hand, the piezoelectric element 29b formed on the upper electrode 49, i.e., in the wiring region, is grown with a pyrochlore structure.

Figure 8A:
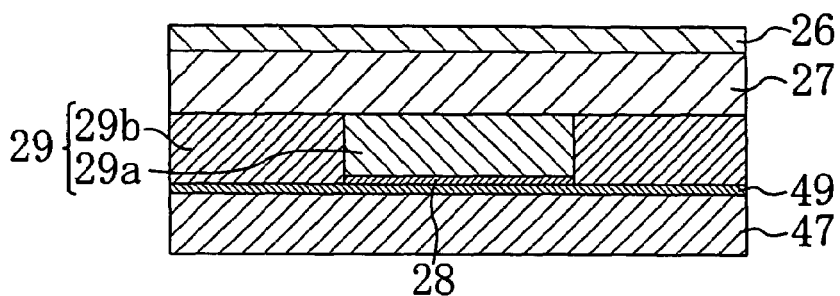
FIG. 8A to FIG. 8D illustrate a part of the manufacturing process of the ink jet head according to Embodiment 1 of the present invention.

Then, as illustrated in FIG. 8A, the common electrode 27 made of Cu is formed on the piezoelectric element 29 by sputtering, vapor deposition, or the like. Then, the vibration plate 26 made of Cr is formed on the common electrode 27 by sputtering, vapor deposition, or the like.

Figure 8B:
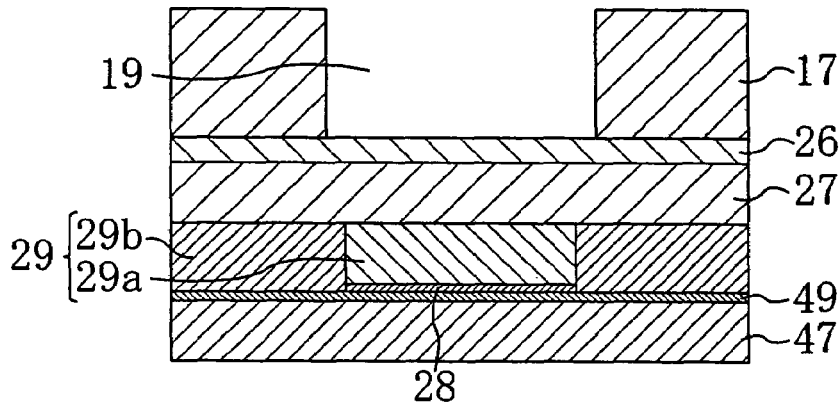

Then, as illustrated in FIG. 8B, the head assembly 17 including the pressure chamber 19 therein is formed on the vibration plate 26 by electrodeposition.

Figure 8C:
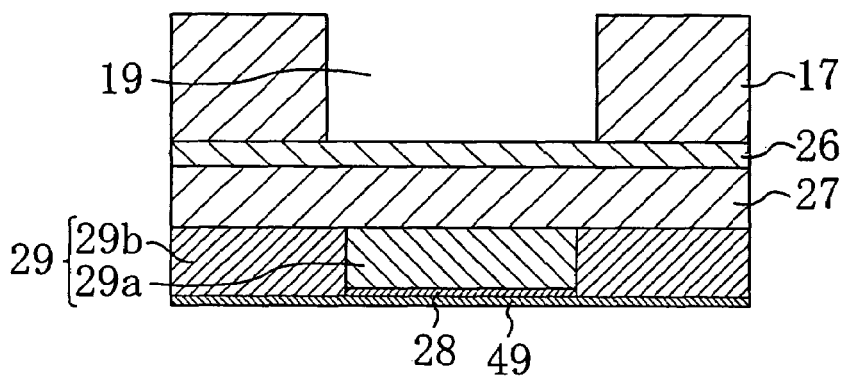

Then, as illustrated in FIG. 8C, the MgO substrate 47 is removed by etching, or the like.

Figure 8D:
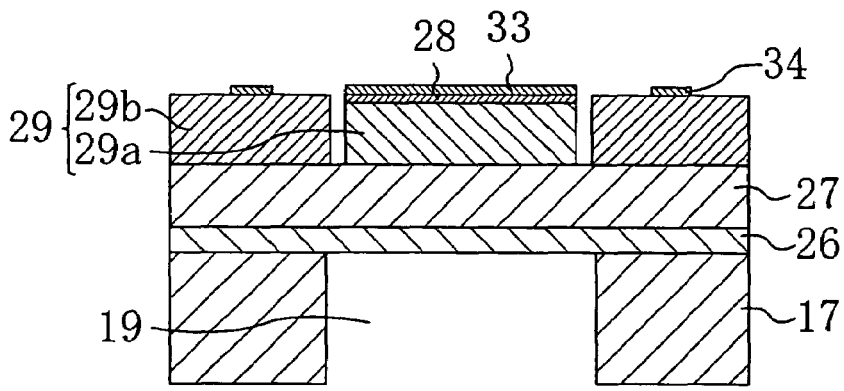

Finally, as illustrated in FIG. 8D, the upper electrode 49 is partially removed by etching, or the like, so as to leave a portion thereof in the displacement region and a portion thereof in each location where the electrode line 34 is to be provided, thereby forming the separate electrode 33 and the electrode line 34. At the same time, the piezoelectric element 29a in the displacement region is separated.

Method for Operating Ink Jet Head

A method for operating the ink jet head of the present embodiment will now be described. First, a voltage is applied between the common electrode 27 and the separate electrode 33. As a voltage is applied between the electrodes 27 and 33, the piezoelectric element 29 contracts/expands. The contraction/expansion is restricted by the vibration plate 26, whereby the piezoelectric actuator 21 undergoes flexural deformation in the thickness direction. The flexural deformation changes the volume of the pressure chamber 19, whereby ink is discharged out of the pressure chamber 19 through the nozzle 15 via the ink channel 25.

In the present embodiment, the crystal control layer 28 made of lead lanthanum titanate is provided between the piezoelectric element 29a in the displacement region and the separate electrode 33, whereby during the step of depositing the piezoelectric element 29, the piezoelectric element 29a in the displacement region can be grown with a perovskite structure. Thus, with the structure of the present embodiment, the piezoelectric element 29a in the displacement region can be grown with a perovskite structure.

Moreover, since the separate electrode 33 also serves to make the lead lanthanum titanate layer function as the crystal control layer 28, the lead lanthanum titanate layer functions more actively as the crystal control layer 28. Therefore, with the structure of the present embodiment, during the step of depositing the piezoelectric element 29, the piezoelectric element 29a in the displacement region can reliably be grown with a perovskite structure.

Moreover, the piezoelectric element 29a in the displacement region has a perovskite structure while the piezoelectric element 29b in the wiring region has a pyrochlore structure, whereby the piezoelectric element 29a in the displacement region is ferroelectric while the piezoelectric element 29b in the wiring region has a lower dielectric constant than that of the piezoelectric element 29a in the displacement region. Therefore, the piezoelectric element 29a in the displacement region has a high piezoelectric characteristic while the overall dielectric constant of the piezoelectric element 29 is decreased. Thus, it is possible to decrease the overall dielectric constant of the piezoelectric element 29 while preventing a decrease in the piezoelectric characteristic of the piezoelectric element 29a in the displacement region.

Moreover, since the piezoelectric element 29 is made of $Pb(Zr,Ti)O_3$, which is ferroelectric, it is possible to realize a high piezoelectric characteristic in the piezoelectric element 29a in the displacement region.

Note that while the separate electrode 33 is made of Pt in the present embodiment, it may alternatively be made of a Pt-Ti alloy or an Ir—Ti alloy.

Embodiment 2

A piezoelectric actuator of the present embodiment has substantially the same structure as that of the piezoelectric actuator of Embodiment 1, except that the crystal control layer is formed on the upper electrode after separating the upper electrode. The piezoelectric actuator of the present embodiment will now be described while focusing on what is different from Embodiment 1.

Figure 9:
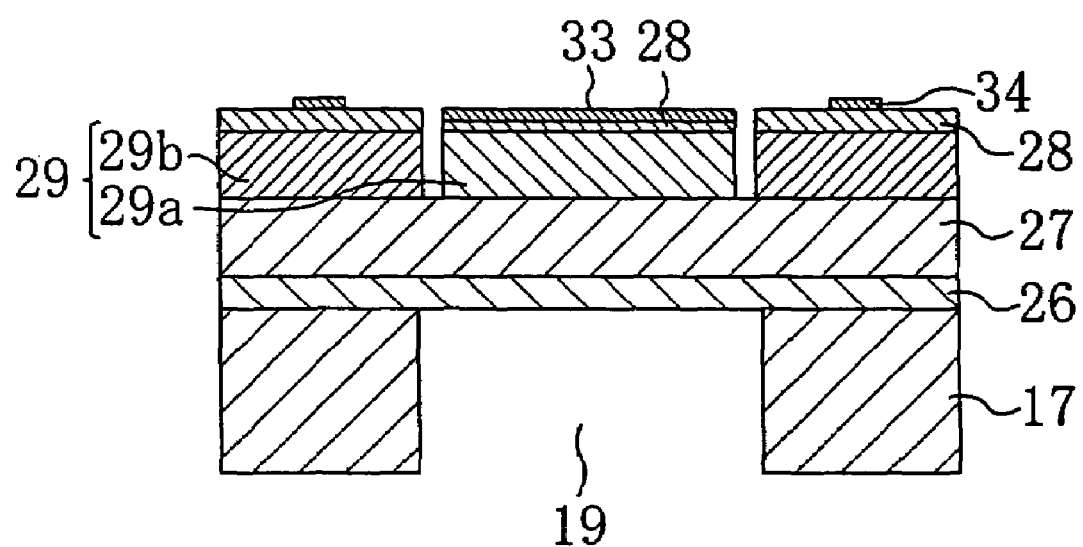
FIG. 9 is a cross-sectional view illustrating an ink jet head according to Embodiment 2 of the present invention.

As illustrated in FIG. 9, the piezoelectric actuator 21 includes the vibration plate 26 made of Cr and having a thickness of 2 μm, the common electrode 27 made of Cu and having a thickness of 5.5 μm, which is formed on the vibration plate 26, the piezoelectric element 29 made of $Pb(Zr,Ti)O_3$ and having a thickness of 3 μm, which is formed on the common electrode 27, the crystal control layer 28 made of lead lanthanum titanate and having a thickness of 0.05 μm, which is formed on the piezoelectric element 29, the separate electrode 33 made of Pt and having a thickness of 0.2 μm, which is formed on the crystal control layer 28, and the electrode line 34 made of Pt and having a thickness of 0.2 μm, which is formed on the crystal control layer 28 and is connected to the separate electrode 33.

Method for Manufacturing Ink Jet Head

Referring to FIG. 10A to FIG. 10E and FIG. 11A to FIG. 11D, a method for manufacturing the ink jet head 1 will now be described. The method for manufacturing the ink jet head 1 to be described below is a so-called "transfer process".

Figure 10A:
FIG. 10A to FIG. 10E illustrate a part of the manufacturing process of the ink jet head according to Embodiment 2 of the present invention.

First, as illustrated in FIG. 10A, the upper electrode 49 made of Pt is formed on the MgO substrate 47.

Figure 10B:
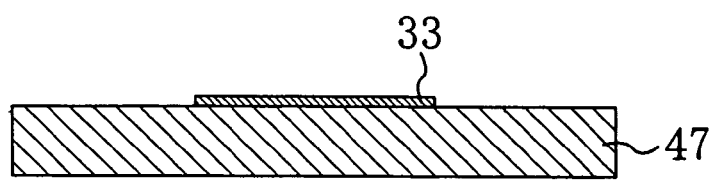

Then, as illustrated in FIG. 10B, the upper electrode 49 is partially removed by etching, or the like, so as to leave a portion thereof in the displacement region, thereby forming the separate electrode 33.

Figure 10C:
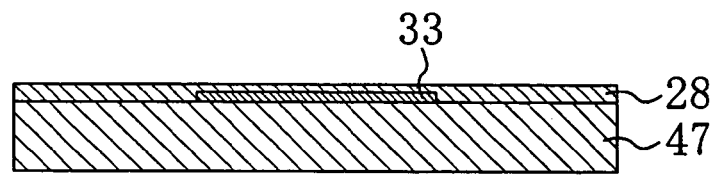

Then, as illustrated in FIG. 10C, the crystal control layer 28 made of lead lanthanum titanate is formed on the separate electrode 33 and the MgO substrate 47 by sputtering, vapor deposition, or the like.

Figure 10D:
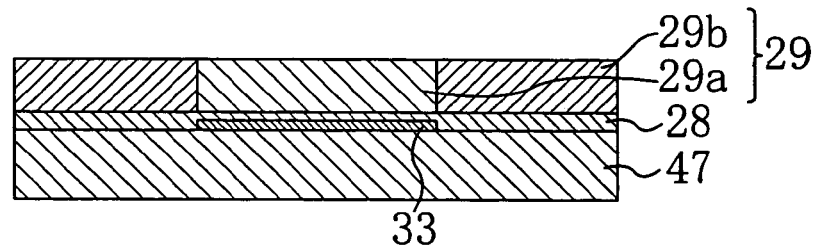

Then, as illustrated in FIG. 10D, the piezoelectric element 29 made of $Pb(Zr,Ti)O_3$ is formed on the crystal control layer 28 by sputtering, vapor deposition, or the like. Thus, the piezoelectric element 29a formed on a portion of the crystal control layer 28 that is formed on the separate electrode 33, i.e., in the displacement region, is grown with a perovskite structure. On the other hand, the piezoelectric element 29b formed on a portion of the crystal control layer 28 that is formed on the MgO substrate 47, i.e., in the wiring region, is grown with a pyrochlore structure. Note that the piezoelectric element 29b formed in the wiring region is not grown with a perovskite structure because the portion of the lead lanthanum titanate layer that is formed directly on the MgO substrate 47 does not sufficiently function as the crystal control layer 28.

Figure 10E:
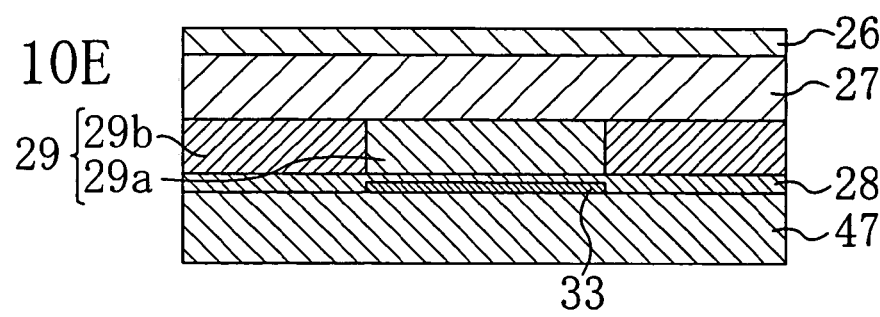

Then, as illustrated in FIG. 10E, the common electrode 27 made of Cu is formed on the piezoelectric element 29 by sputtering, vapor deposition, or the like. Then, the vibration plate 26 made of Cr is formed on the common electrode 27 by sputtering, vapor deposition, or the like.

Figure 11A:
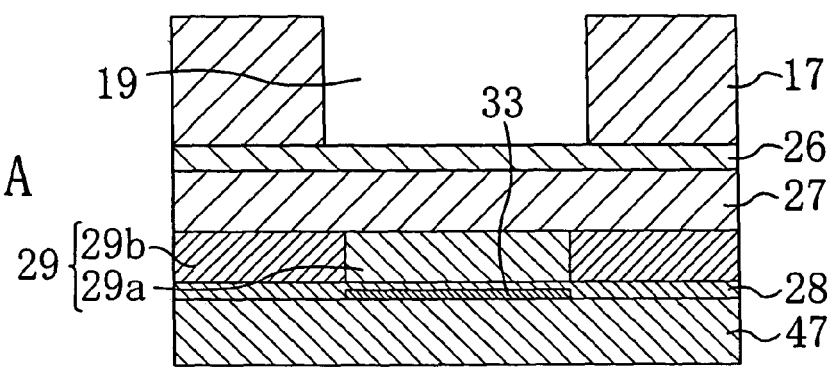
FIG. 11A to FIG. 11D illustrate a part of the manufacturing process of the ink jet head according to Embodiment 2 of the present invention.
Figure 11B:
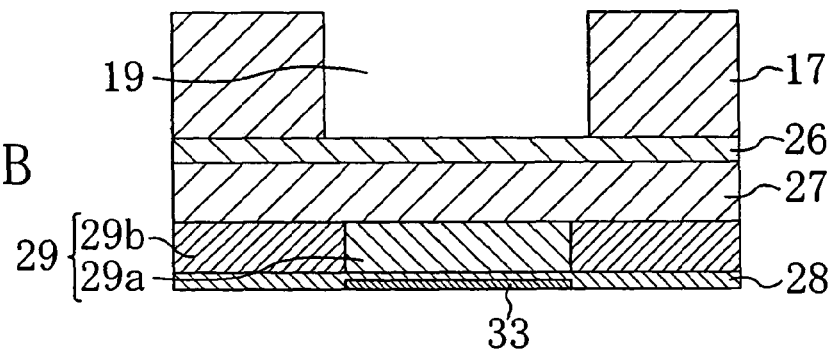

Then, as illustrated in FIG. 11A, the head assembly 17 including the pressure chamber 19 therein is formed on the vibration plate 26 by electrodeposition.

Then, as illustrated in FIG. 1B, the MgO substrate 47 is removed by etching, or the like.

Figure 11C:
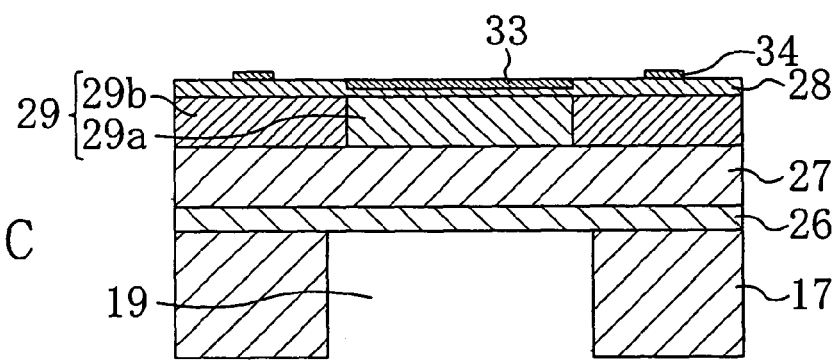

Then, as illustrated in FIG. 11C, a Pt layer is formed on the crystal control layer 28 in the wiring region, and the Pt layer is partially removed by etching, or the like, so as to leave a portion thereof in each location where the electrode line 34 is to be provided, thereby forming the electrode line 34.

Figure 11D:
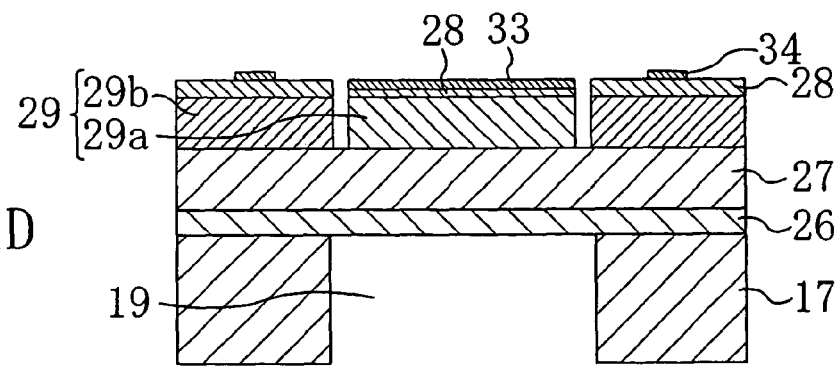

Finally, as illustrated in FIG. 11D, the separate electrode 33 and the piezoelectric element 29a in the displacement region are separated by etching, or the like.

Note that effects similar to those of Embodiment 1 can be obtained in the present embodiment.

Embodiment 3

A piezoelectric actuator of the present embodiment has substantially the same structure as that of the piezoelectric actuator of Embodiment 1, except that it is manufactured by a so-called "direct process". The piezoelectric actuator of the present embodiment will now be described while focusing on what is different from Embodiment 1.

Figure 12:
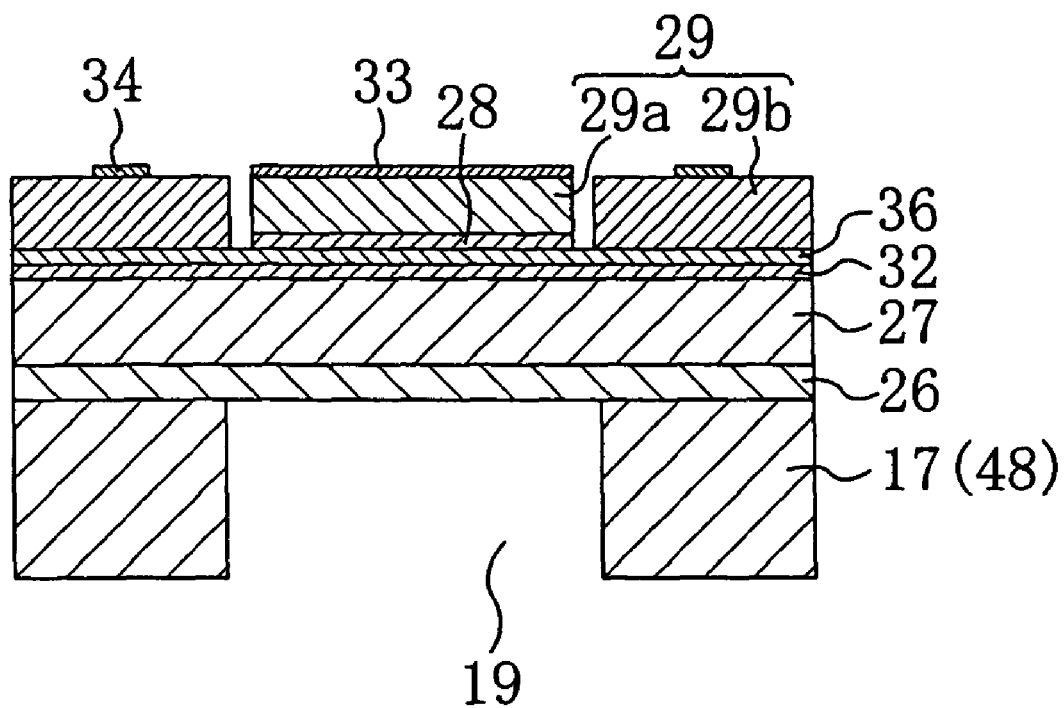
FIG. 12 is a cross-sectional view illustrating an ink jet head according to Embodiment 3 of the present invention.

As illustrated in FIG. 12, the piezoelectric actuator 21 includes the vibration plate 26 made of Cr and having a thickness of 2 μm, the common electrode 27 made of Cu and having a thickness of 5.5 μm, which is formed on the vibration plate 26, an adhesive layer 32 made of Ti and having a thickness of 50 nm, which is formed on the common electrode 27, an orientation control layer 36 made of a Pt—Ti alloy and having a thickness of 0.2 μm, which is formed on the adhesive layer 32, the crystal control layer 28 made of lead lanthanum titanate and having a thickness of 50 nm, which is formed on the orientation control layer 36, the piezoelectric element 29 made of $Pb(Zr,Ti)O_3$ and having a thickness of 3 μm, which is formed on the crystal control layer 28, the separate electrode 33 made of Pt and having a thickness of 0.2 μm, which is formed on the piezoelectric element 29, and the electrode line 34 made of Pt and having a thickness of 0.2 μm, which is formed on the piezoelectric element 29 and is connected to the separate electrode 33. Note that the orientation control layer 36 corresponds to the "active layer" as used herein.

The adhesive layer 32 serves to bond together the common electrode 27 and the orientation control layer 36. The orientation control layer 36 controls the crystalline orientation of the piezoelectric element 29 to be formed thereon so that the piezoelectric element 29a in the displacement region is grown with a perovskite structure, irrespective of the material of the substrate. Moreover, the orientation control layer 36 also serves to make the lead lanthanum titanate layer function as the crystal control layer 28. The Ti content of the orientation control layer 36 is 1 to 2%.

Method for Manufacturing Ink Jet Head

Referring to FIG. 13A to FIG. 13E and FIG. 14A to FIG. 14E, a method for manufacturing the ink jet head 1 will now be described. The method for manufacturing the ink jet head 1 to be described below is a so-called "direct process".

Figure 13A:
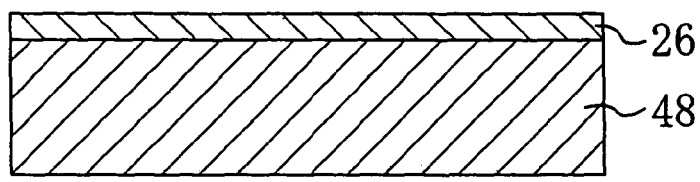
FIG. 13A to FIG. 13E illustrate a part of the manufacturing process of the ink jet head according to Embodiment 3 of the present invention.

First, as illustrated in FIG. 13A, the vibration plate 26 made of Cr is formed on an Si substrate 48.

Figure 13B:
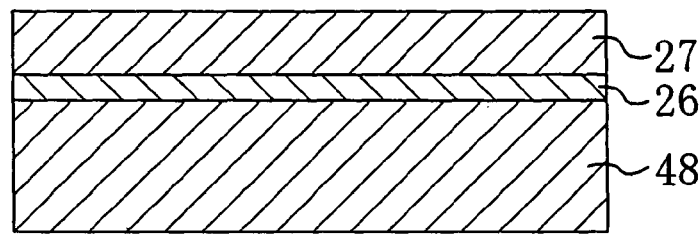

Then, as illustrated in FIG. 13B, the common electrode 27 made of Cu is formed on the vibration plate 26.

Figure 13C:
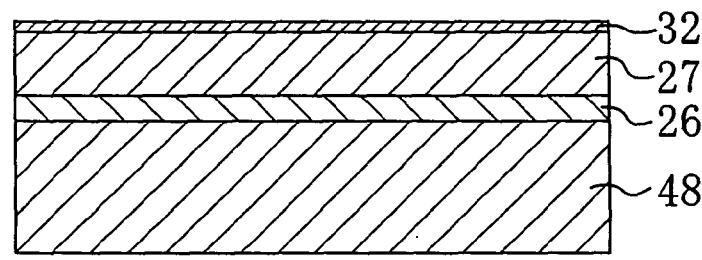

Then, as illustrated in FIG. 13C, the adhesive layer 32 made of Ti is formed on the common electrode 27.

Figure 13D:
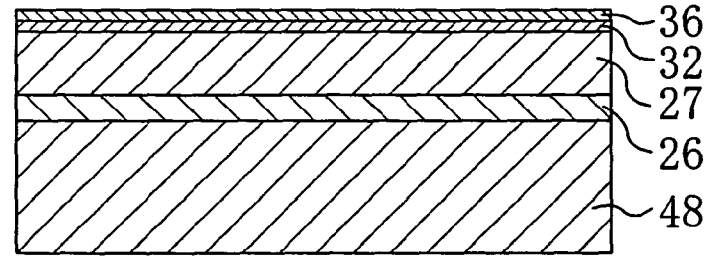

Then, as illustrated in FIG. 13D, the orientation control layer 36 made of a Pt—Ti alloy is formed on the adhesive layer 32.

Figure 13E:
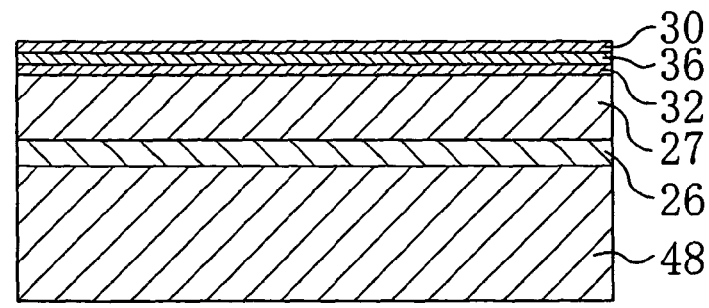

Then, as illustrated in FIG. 13E, the lead lanthanum titanate layer 30 is formed on the orientation control layer 36.

Figure 14A:
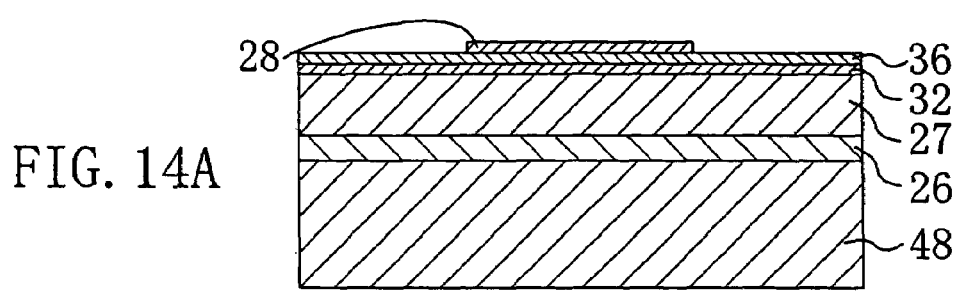
FIG. 14A to FIG. 14E illustrate a part of the manufacturing process of the ink jet head according to Embodiment 3 of the present invention.

Then, as illustrated in FIG. 14A, the lead lanthanum titanate layer 30 is partially removed by etching, or the like, so as to leave a portion thereof in the displacement region, thereby forming the crystal control layer 28.

Figure 14B:
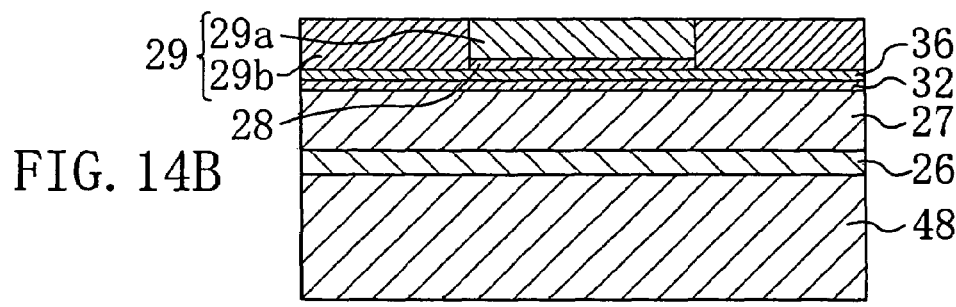

Then, as illustrated in FIG. 14B, the piezoelectric element 29 made of $Pb(Zr,Ti)O_3$ is formed on the crystal control layer 28 and the orientation control layer 36 by sputtering, vapor deposition, or the like. Thus, the piezoelectric element 29a formed on the crystal control layer 28, i.e., in the displacement region, is grown with a perovskite structure. On the other hand, the piezoelectric element 29b formed on the orientation control layer 36, i.e., in the wiring region, is grown with a pyrochlore structure.

Figure 14C:
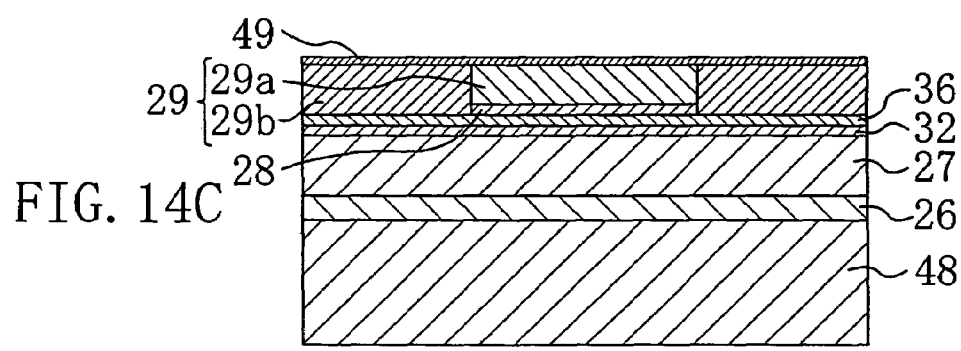

Then, as illustrated in FIG. 14C, the upper electrode 49 made of Pt is formed on the piezoelectric element 29 by sputtering, vapor deposition, or the like.

Figure 14D:
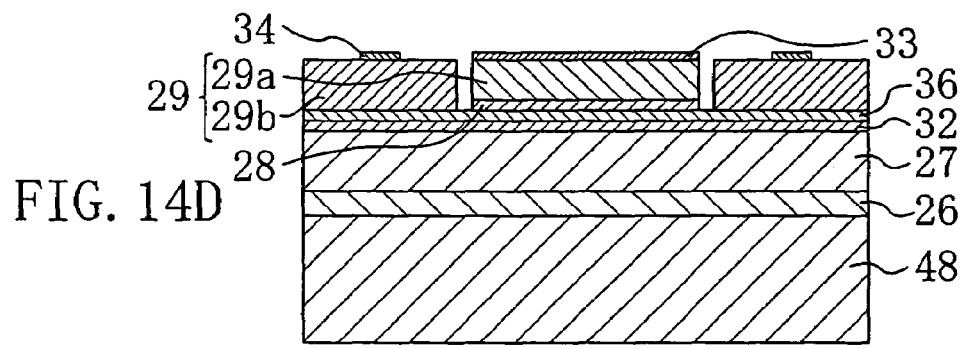

Then, as illustrated in FIG. 14D, the upper electrode 49 is partially removed by etching, or the like, so as to leave a portion thereof in the displacement region and a portion thereof in each location where the electrode line 34 is to be provided, thereby forming the separate electrode 33 and the electrode line 34. At the same time, the piezoelectric element 29a in the displacement region is separated.

Figure 14E:
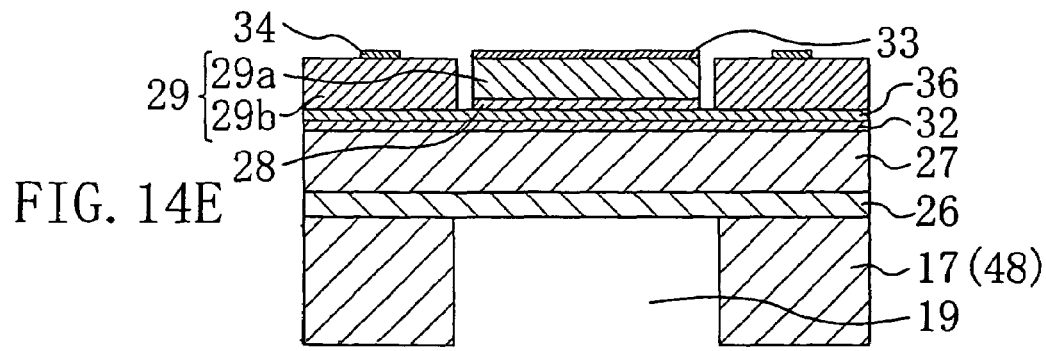

Finally, as illustrated in FIG. 14E, the Si substrate 48 is machined into the head assembly 17 including the pressure chamber 19 formed therein. Note that a stopper layer (not shown) may alternatively be provided between the Si substrate 48 and the vibration plate 26 so as to facilitate the process of machining the Si substrate 48 to form the pressure chamber 19.

Note that effects similar to those of Embodiment 1 can be obtained in the present embodiment.

Note that while the adhesive layer 32 is provided between the common electrode 27 and the orientation control layer 36 in the present embodiment, the adhesive layer 32 may be optional.

While the orientation control layer 36 is made of a Pt-Ti alloy in the present embodiment, it may alternatively be made of an Ir—Ti alloy.

Figure 15:
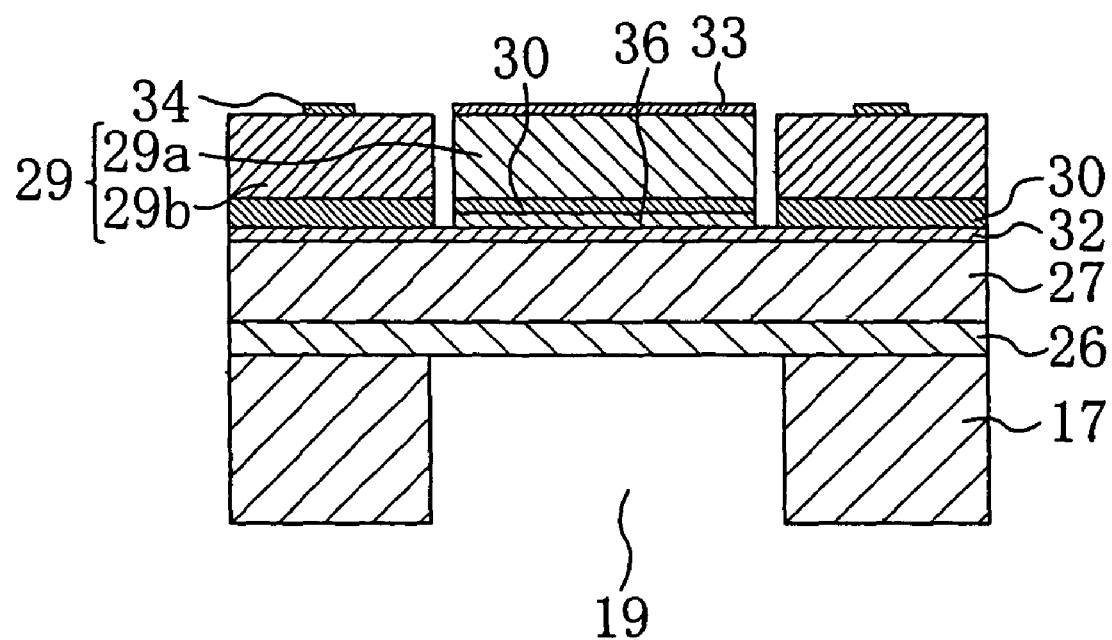
FIG. 15 is a cross-sectional view illustrating an ink jet head according to a variation of Embodiment 3 of the present invention.

Moreover, in the present embodiment, the crystal control layer 28 is formed by partially removing the lead lanthanum titanate layer 30 by etching, or the like, so as to leave a portion thereof in the displacement region. Alternatively, the orientation control layer 36 made of a Pt—Ti alloy, instead of the lead lanthanum titanate layer 30, may be partially removed so as to leave a portion thereof in the displacement region, as illustrated in FIG. 15, and the piezoelectric element 29a in the displacement region will still be grown with a perovskite structure as described above.

Furthermore, in the embodiments above, the vibration plate 26 and the common electrode 27 are provided separately. Alternatively, the common electrode 27 may function also as a vibration plate.

Moreover, in the embodiments above, the piezoelectric element 29 is made of $Pb(Zr,Ti)O_3$. Alternatively, the piezoelectric element 29 may be made of, for example, a piezoelectric ceramic material including at least one of lead titanate ($PbTiO_3$), lead zirconate titanate ($Pb(Zr,Ti)O_3$), lead zirconate ($PbZrO_3$), lead lanthanum titanate (($Pb,La)TiO_3$), lead lanthanum zirconate titanate (($Pb,La)(Zr,Ti)O_3$) and lead magnesium niobate ($Pb(Mg,Nb)O_3$). Furthermore, the thickness of the piezoelectric element may be different from those shown in the embodiments above.

Moreover, in the embodiments above, the common electrode 27 is formed on the head assembly 17. Alternatively, the separate electrode 33 may be formed on the head assembly 17. In such a case, the common electrode 27 is formed on the piezoelectric element 29.

Furthermore, the material and the thickness of the common electrode 27, the separate electrode 33, the head assembly 17, etc., may be different from those shown in the embodiments above.

INDUSTRIAL APPLICABILITY

Thus, the present invention can suitably be used in printers for computers, facsimiles, copiers, etc.

The invention claimed is:

1. A piezoelectric actuator, comprising a lower electrode, a piezoelectric layer formed on the lower electrode, and an upper electrode formed on the piezoelectric layer for applying, together with the lower electrode, a voltage across the piezoelectric layer, wherein:
   the piezoelectric layer includes a piezoelectric layer in a displacement region that is located directly above a pressure chamber and a piezoelectric layer in a wiring region that is a region other than the displacement region; and
   a dielectric constant of the piezoelectric layer in the wiring region is lower than that of the piezoelectric layer in the displacement region.

2. A piezoelectric actuator, comprising a lower electrode, a piezoelectric layer formed on the lower electrode, and an upper electrode formed on the piezoelectric layer for applying, together with the lower electrode, a voltage across the piezoelectric layer, wherein:
   the piezoelectric layer includes a piezoelectric layer in a displacement region that is located directly above a pressure chamber and a piezoelectric layer in a wiring region that is a region other than the displacement region; and the piezoelectric layer in the displacement region has a perovskite structure while the piezoelectric layer in the wiring region has a pyrochiore structure.

3. The piezoelectric actuator of claim 2, wherein a crystal control layer made of lead lanthanum titanate is formed on a surface of the piezoelectric layer in the displacement region that is closer to the upper electrode or on a surface thereof that is closer to the lower electrode.

4. The piezoelectric actuator of claim 3, wherein an active layer made of one of Pt, a Pt-Ti alloy and an Ir-Ti alloy is formed on a surface of the crystal control layer that is away from the piezoelectric layer.

5. The piezoelectric actuator of claim 1, wherein the piezoelectric layer is made of a piezoelectric ceramic material including at least one of lead titanate, lead zirconate titanate, lead zirconate, lead lanthanum titanate, lead lanthanum zirconate titanate and lead magnesium niobate.

6. The piezoelectric actuator of claim 2, wherein the piezoelectric layer is made of a piezoelectric ceramic material including at least one of lead titanate, lead zirconate titanate, lead zirconate, lead lanthanum titanate, lead lanthanum zirconate titanate and lead magnesium niobate.

7. An ink jet head, comprising the piezoelectric actuator of claim 1.

8. An ink jet head, comprising the piezoelectric actuator of claim 2.

9. An ink jet recording apparatus, comprising the ink jet head of claim 7.

10. An ink jet recording apparatus, comprising the ink jet head of claim 8.

* * * * *

UNITED STATES PATENT AND TRADEMARK OFFICE
CERTIFICATE OF CORRECTION

PATENT NO. : 7,063,407 B2
APPLICATION NO. : 10/637833
DATED : June 20, 2006
INVENTOR(S) : Kazuo Nishimura It is certified that error appears in the above-identified patent and that said Letters Patent is hereby corrected as shown below:

In the Claims:

Column 12

Line 55, Claim 2: "pyrochiore" should be --pyrochlore--

Signed and Sealed this

Fifth Day of December, 2006

JON W. DUDAS
*Director of the United States Patent and Trademark Office*